United States Patent
Foster, Sr.

(10) Patent No.: US 7,200,023 B2
(45) Date of Patent: Apr. 3, 2007

(54) DUAL-EDGED DIMM TO SUPPORT MEMORY EXPANSION

(75) Inventor: Jimmy Grant Foster, Sr., Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 11/127,516

(22) Filed: May 12, 2005

(65) Prior Publication Data

US 2006/0256603 A1    Nov. 16, 2006

(51) Int. Cl.
*G11C 5/06*    (2006.01)

(52) U.S. Cl. .............. 365/63; 365/189.05; 365/230.05; 365/52

(58) Field of Classification Search .................. 365/63, 365/189.05, 230.03, 51
See application file for complete search history.

(56) References Cited

U.S. PATENT DOCUMENTS

| | | | |
|---|---|---|---|
| 5,357,621 A * | 10/1994 | Cox | 711/172 |
| 5,506,788 A * | 4/1996 | Cheng et al. | 716/10 |
| 6,388,886 B1 * | 5/2002 | Tobita | 365/63 |
| 6,721,195 B2 | 4/2004 | Brunelle et al. | |
| 2003/0011391 A1 | 1/2003 | Brunelle et al. | |
| 2003/0107365 A1 | 6/2003 | Brunelle et al. | |
| 2003/0137862 A1 | 7/2003 | Brunelle et al. | |

* cited by examiner

*Primary Examiner*—Huan Hoang
(74) *Attorney, Agent, or Firm*—Cynthia S. Byrd; Dillon & Yudell LLP (57) ABSTRACT

A method and system for expanding the number of memory modules that can be coupled to a motherboard such as a server blade is presented. A stack of multiple Dual In-line Memory Modules (DIMMs) is formed using novel double-connector-edge DIMMs, which each have connector pins on their opposite edges. Alternatively, the double-connector-edge DIMM is used to couple the motherboard to a memory expansion card that has multiple single-edge pinned DIMMs coupled in a "daisy-chain."

16 Claims, 9 Drawing Sheets

FIG. 6C

DUAL-EDGED DIMM TO SUPPORT MEMORY EXPANSION

BACKGROUND OF THE INVENTION

1. Technical Field

The present invention relates in general to the field of computers, and in particular to memory devices. Still more particularly, the present invention relates to a method and system for expanding memory using a novel memory module that has connector pins on its opposite edges.

2. Description of the Related Art

Recent advances in high volume servers have introduced 64-bit processors and operating systems. These systems are capable of directly addressing vast amounts of memory. Therefore, to utilize all of this computing power, users are demanding much more memory capacity.

Some high density servers are so small that they can support only a limited number of memory sockets. For example, consider a server blade 102 shown in FIG. 1a. Server blade 102 is populated with, inter alia, a Central Processing Unit (CPU) 104, which is often a cluster of multiple processors. Data is supplied to CPU 104 by a memory controller 106, which is coupled to CPU 104 via a Northbridge chipset 105. (Consequently, data that is being sent to CPU 104 is called "northbound," while data traveling away from CPU 104 is called "southbound.") While CPU 104, chipset 105, and memory controller 106 are depicted as separate components, oftentimes their function is integrated together into one or two chips.

Figure 1A:
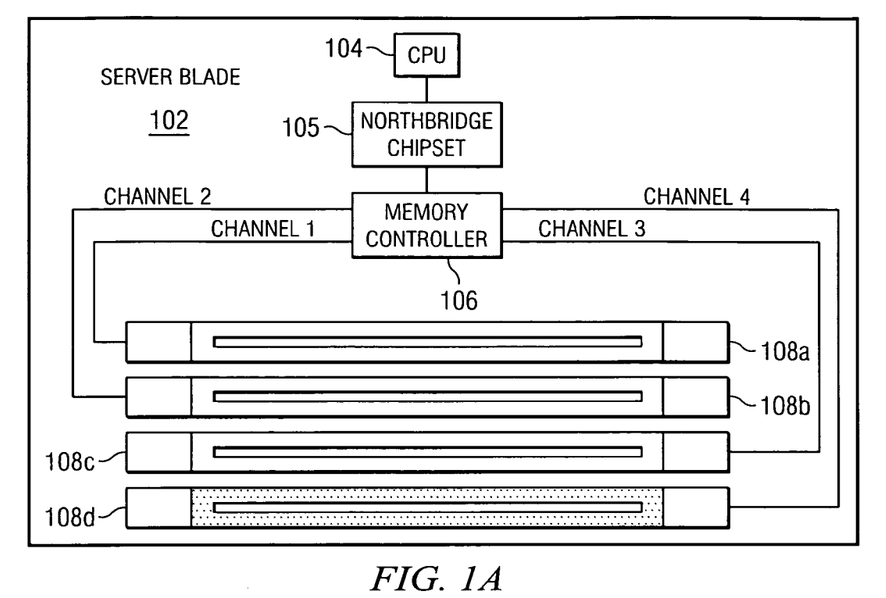
FIGS. 1a–c depict a prior art blade server chassis using standard Dual In-line Memory Modules (DIMMs)

Coupled to memory controller 106 are multiple data channels (buses), including the depicted Channels 1–4 which are respectively connected to memory sockets 108a–d. Alternatively, memory controller 106 can use only two channels, such that Channel 1 is coupled to and supports memory sockets 108a–b, Channel 2 is coupled to and supports memory sockets 108c–d, and there are no Channels 3–4.

Figure 1B:
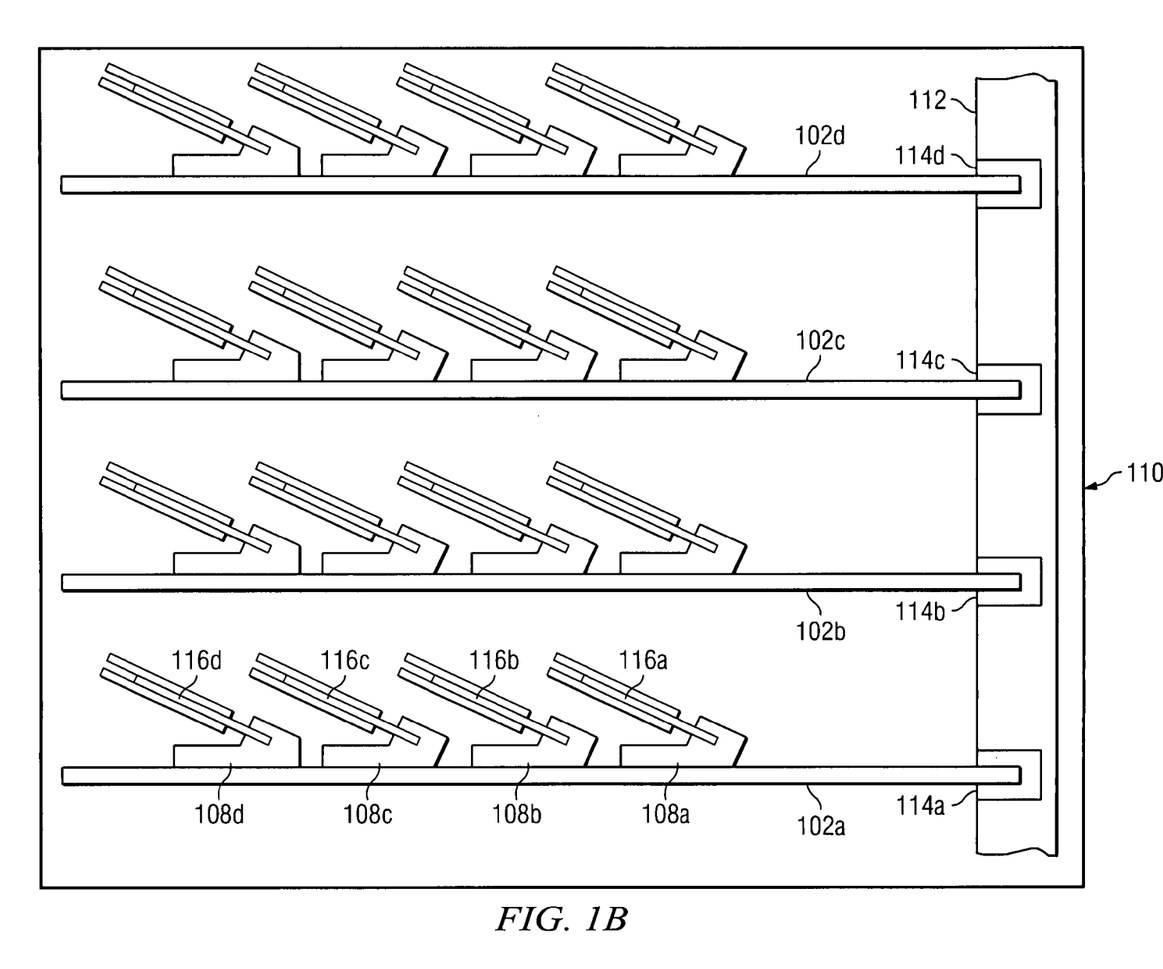

With reference now to FIG. 1b, multiple server blades 102a–d are utilized within a blade server chassis 110. Server blades 102a–d are connected to a midplane 112 (a backplane positioned in a center portion of the blade server chassis 110) via respective board slots 114a–d. As shown in FIG. 1b, spacing between server blades 102 is limited. Therefore, the memory sockets 108 are configured to orient memory modules 116 at an angle, in order to provide adequate clearance between boards that make up the server blades 102.

Figure 1C:
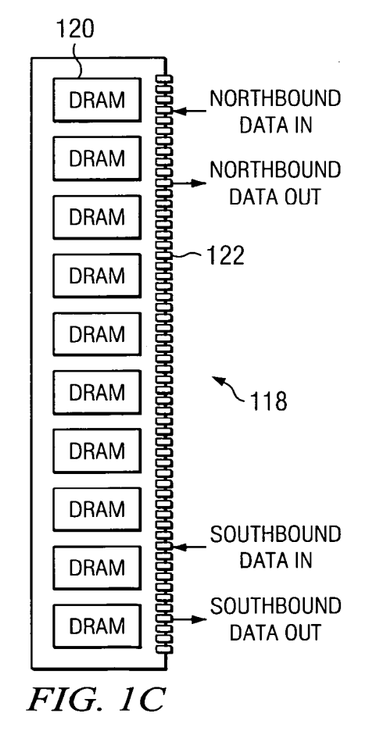

A typical memory module 116 is shown in FIG. 1c, which shows a Dual In-line Memory Module (DIMM) 118 having multiple Dynamic Random Access Memories (DRAMs) 120. DIMM 118 electrically couples with memory sockets 108 via single-edge pins 122, which are all on one edge of DIMM 118.

Although not shown, typically DIMM 118 is coupled in series with other DIMMs 118 on other memory sockets 108. Thus, each DIMM 118 must be able to pass-through data that is to be stored in another DIMM 118. As will be shown to be significant below, northbound data enters DIMM 118 on a first set of pins, northbound data exits DIMM 118 on a different second set of pins, southbound data enters DIMM 118 on a different third set of pins, and southbound data exits DIMM 118 on a different fourth set of pins, where the first, second, third and fourth sets of pins are all part of single-edge pins 122.

As can be seen in FIGS. 1a–c, the amount of memory that can be placed on a single server blade 102 is limited by space. That is, there is simply no physical room to add more memory.

SUMMARY OF THE INVENTION

In response to the shortcomings of the prior art system described, the present invention is thus directed to a method and system for expanding the number of memory modules that can be coupled to a motherboard such as a server blade. A stack of multiple Dual In-line Memory Modules (DIMMs) is formed using novel double-connector-edge DIMMs, which each have connector pins on their opposite edges. Alternatively, the double-connector-edge DIMM is used to couple the motherboard to a memory expansion card that has multiple single-edge pinned DIMMs coupled in a "daisy-chain." In another embodiment, a Dual Inline Buffer Module (DIBM), which has a buffer for redrive but no DRAMs, coupled the motherboard to the memory expansion card.

The above, as well as additional purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 2:
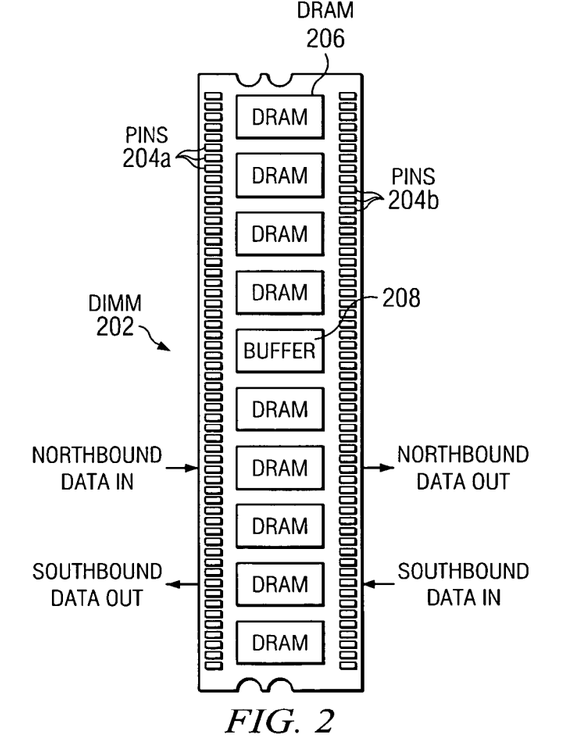
FIG. 2 illustrates an inventive DIMM having connector pins on opposite edges of the DIMM.

With reference now to the FIG. 2, there is depicted an inventive double-connector-edge Dual In-line Memory Module (DIMM) 202. On opposite edges of double-connector-edge DIMM 202 are pins 204a and 204b. Preferably, pins 204a and 204b each number 240 pins, in order to conform to the standard number of pins in a Low Profile (LP) DIMM (having a height of 1.2") and a Very Low Profile (VLP) DIMM (having a height of 0.72"). Pins 204 provide electrical inputs for data and related signals as well as power and ground connections. As shown, double-connector-edge DIMM 202 has multiple Dynamic Random Access Memories (DRAMs) 206 for storing data.

In addition, double-connector-edge DIMM 202 has a buffer 208. Buffer 208, as the name implies, is a buffer for all data (including but not limited to data to be stored; data addresses; control signals such as Row Address Strobe (RAS) and Column Address Strobe (CAS), write enable, read enable, chip select, clock input, Error Correction Code—ECC check bits, Cyclic Redundancy Check—CRC bits, etc.) coming off a bus (channel). Buffer 208 takes data from one of the edge connectors (e.g., pins 204*a*) and sends it on to the other edge connectors (pins 204*b*). Pins 204*a* and 204*b* are therefore electrically directly isolated from each other by buffer 208. Buffer 208 includes drivers that are able to re-send each received and buffered (temporarily stored) data, thus keeping the data being transmitted free of distortion. Thus, data sent through daisy-chained double-connector-edge DIMMs 202 is kept error free during long distance transmissions.

Note that northbound data (traveling towards a CPU) enters double-connector-edge DIMM 202 through a first subset of pins 204*a*, and exits double-connector-edge DIMM 202 through a first subset of pins 204*b*. Similarly, southbound data (traveling away from a CPU) enters double-connector-edge DIMM 202 through a second subset of pins 204*b*, and exits double-connector-edge DIMM 202 through a second subset of pins 204*a*. Thus, compared to DIMM 118 shown in FIG. 1*c*, fewer pins are used for data flow. That is, while DIMM 118 uses four sets of pins for northbound and southbound data going in and out of a single edge of DIMM 118 (as described in FIG. 1's written description), double-connector-edge DIMM 202 has only two sets of pins on each edge for data going in and out of double-connector-edge DIMM 202. This frees up two sets of pins on each edge, which can be reused for additional power supplies (to power the DIMM) and grounds (used primarily to keep data signals free of distortion), or to be used as redundant data pins using an appropriately modified DIMM connector.

Figure 3A:
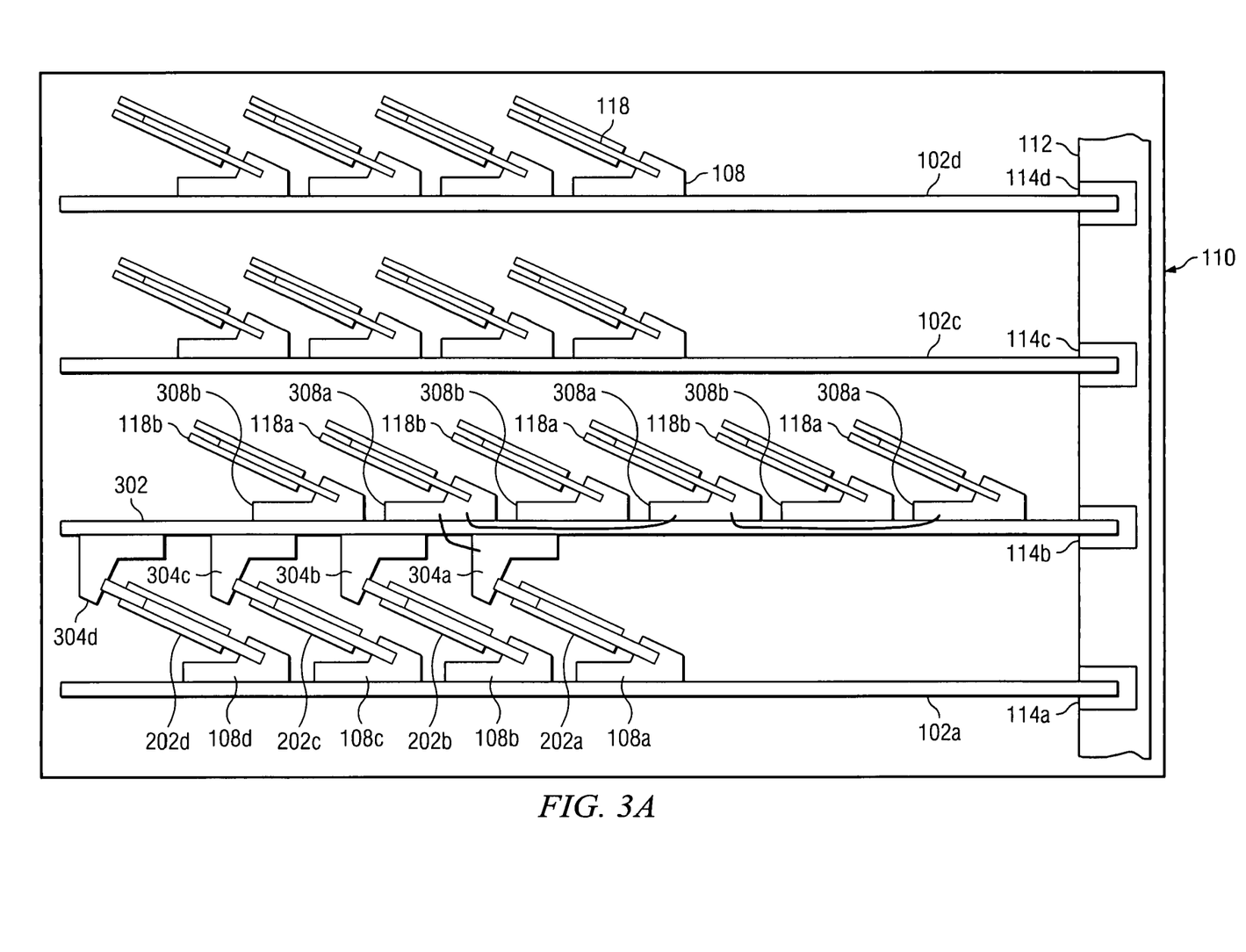
FIGS. 3a–b depict a server blade motherboard coupled to a DIMM expansion card using the inventive DIMM shown in FIG. 2.

With reference now to FIG. 3*a*, blade server chassis 110 is shown using double-connector-edge DIMMs 202 as connectors to a DIMM expansion card 302. Note that blade server chassis 110 has server blade motherboards 102*d*, 102*c* and 102*a* as shown above in FIG. 1*b*. However, server blade motherboard 102*b* has been replaced with DIMM expansion card 302, which is inserted into board slot 114*b*. As suggested by the dashed line end, server blade motherboard 102*b* may be electrically not connected to board slot 114*b*, or server blade motherboard 102*b* may be electrically connected just as the other server blade motherboards 102*a*–*c* and *d* to provide power and data support to DIMM expansion card 302 and any (not shown) components that may populate DIMM expansion card 302.

Figure 3B:
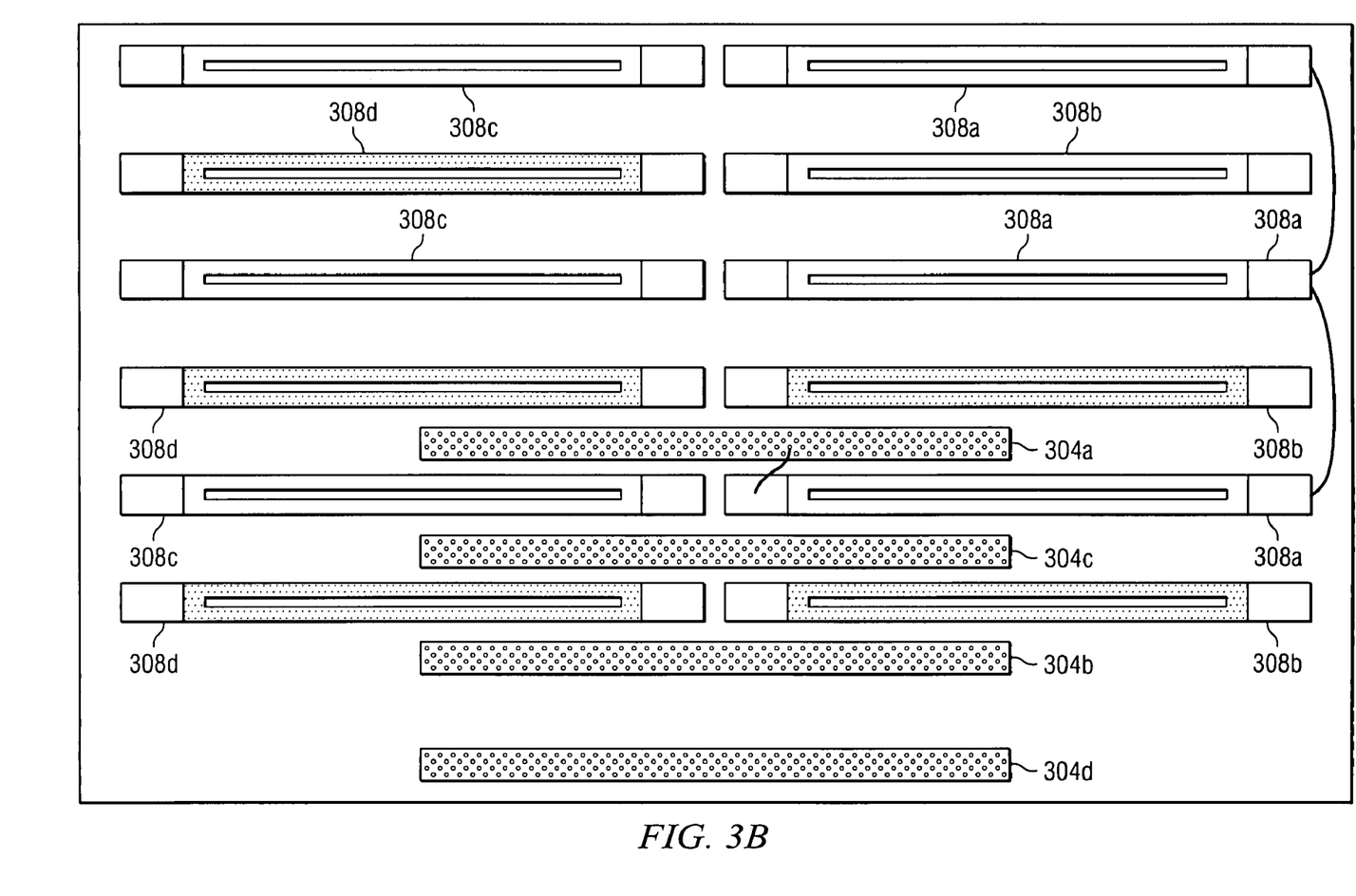

Memory socket 108*a* is plugged into (preferably using pins 204*a*) double-connector-edge DIMM 202*a*. Double-connector-edge DIMM 202*a* is plugged into (preferably using pins 204*b*) a DIMM expansion card connector 304*a* on DIMM expansion card 302. DIMM expansion card connector 304*a* is electrically connected in daisy-chain series to all memory sockets 308*a* (as shown in FIG. 3*b*), each of which has plugged in a single-connector-edge DIMM 118*a*. Similar respective connections are made for memory sockets 108*b*–*d*, double-connector-edge DIMMS 202*b*–*d*, DIMM expansion card connectors 304*b*–*d*, memory sockets 308*b*–*d*, and single-connector-edge DIMMs 118*b*–*d*. Note that single-connector-edge DIMMs 118 are preferably LP DIMMs (described above as having a height of 1.2"). Note that memory sockets 108 and 308 are structurally identical, and vary only by which type of DIMM (118 or 202) is plugged in at any given time.

Figure 4:
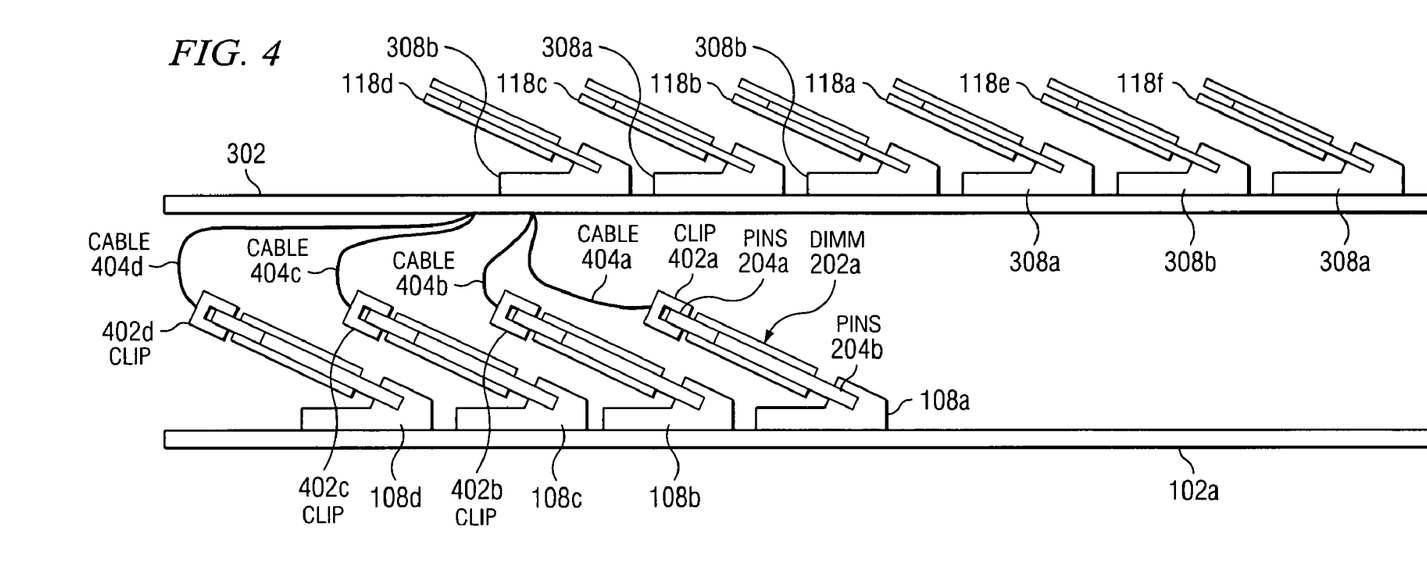
FIG. 4 illustrates the server blade motherboard coupled to the DIMM expansion card using a combination of the inventive DIMM and cables.

Referring now to FIG. 4, DIMM expansion card 302 can be coupled to server blade motherboard 102*a* using clips 402 and cables 404. For example, double-connector-edge DIMM 202*a* is plugged into memory socket 108*a* using pins 204*b*, while pins 204*a* are plugged into clip 402*a*, which is connected to cable 404*a*, which provides a same daisy-chain connection to memory sockets 308*a*.

Figure 5:
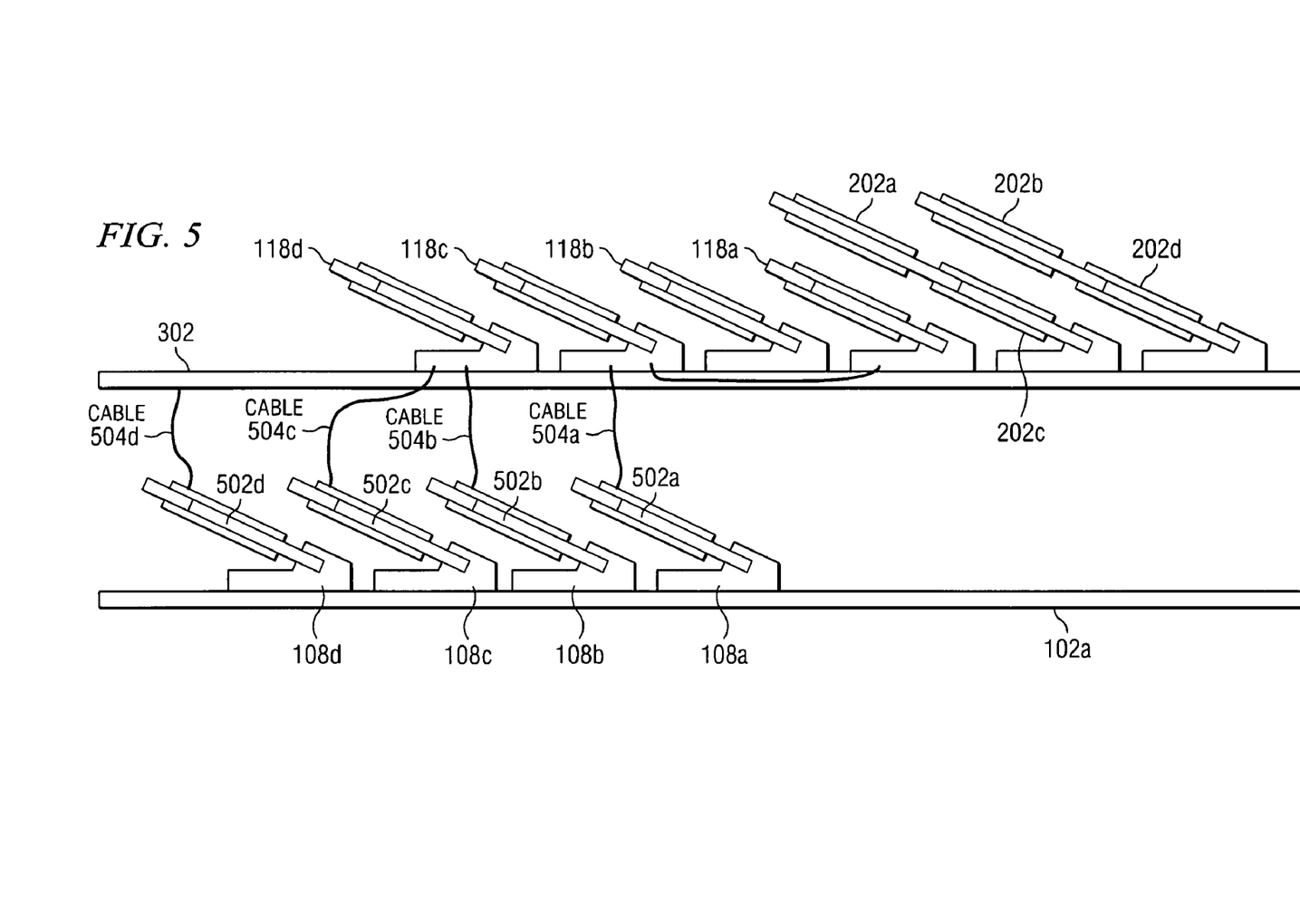
FIG. 5 depicts the server blade motherboard coupled via cables to the DIMM expansion card, which reuses the inventive DIMM's shown on the server blade motherboard in FIG. 4 on the DIMM expansion card.

With reference now to FIG. 5, an alternate configuration for coupling DIMM expansion card 302 to server blade motherboard 102*a* is depicted. A raw connector plug 502, which has a cable 504 going to DIMM expansion card 302, is plugged directly into a memory socket 108. Raw connector plug 502 has no memory (DRAMs), and thus is a "raw" (unpopulated) device. However, in a preferred embodiment, raw connector plug 502, while having no DRAMs, does have a driver buffer (not shown) such as buffer 208 described above, thus allowing data to be passed through and driven "cleanly." As shown in FIG. 5, exemplary cable 504*a* ultimately provides coupling to all of the daisy chained memory sockets 302*a* on DIMM expansion card 302. Note also that double-connector-edge DIMMs 202*a*–*d*, which were coupled to server blade motherboard 102*a* in FIG. 4, have now been moved up to DIMM expansion card 302, wherein they provide memory storage as well as buffered data communication to "upstream" DIMMs. While FIG. 5 shows DIMMs 202*a*–*b* respectively coupled to DIMMS 202*c*–*d*, alternatively DIMMs 202*a*–*b* may be single-connector-edge DIMMs 118.

Note that a raw connector plug 502 having no DRAMs but having a driver buffer such as buffer 208 can be used to couple motherboard 102 to DIMM expansion card 302 using connections shown in FIGS. 3*a* and 4, replacing DIMMs 202 with raw connector plugs 502, each raw connector plug 502 preferably having a driver buffer such as buffer 208.

Figure 6A:
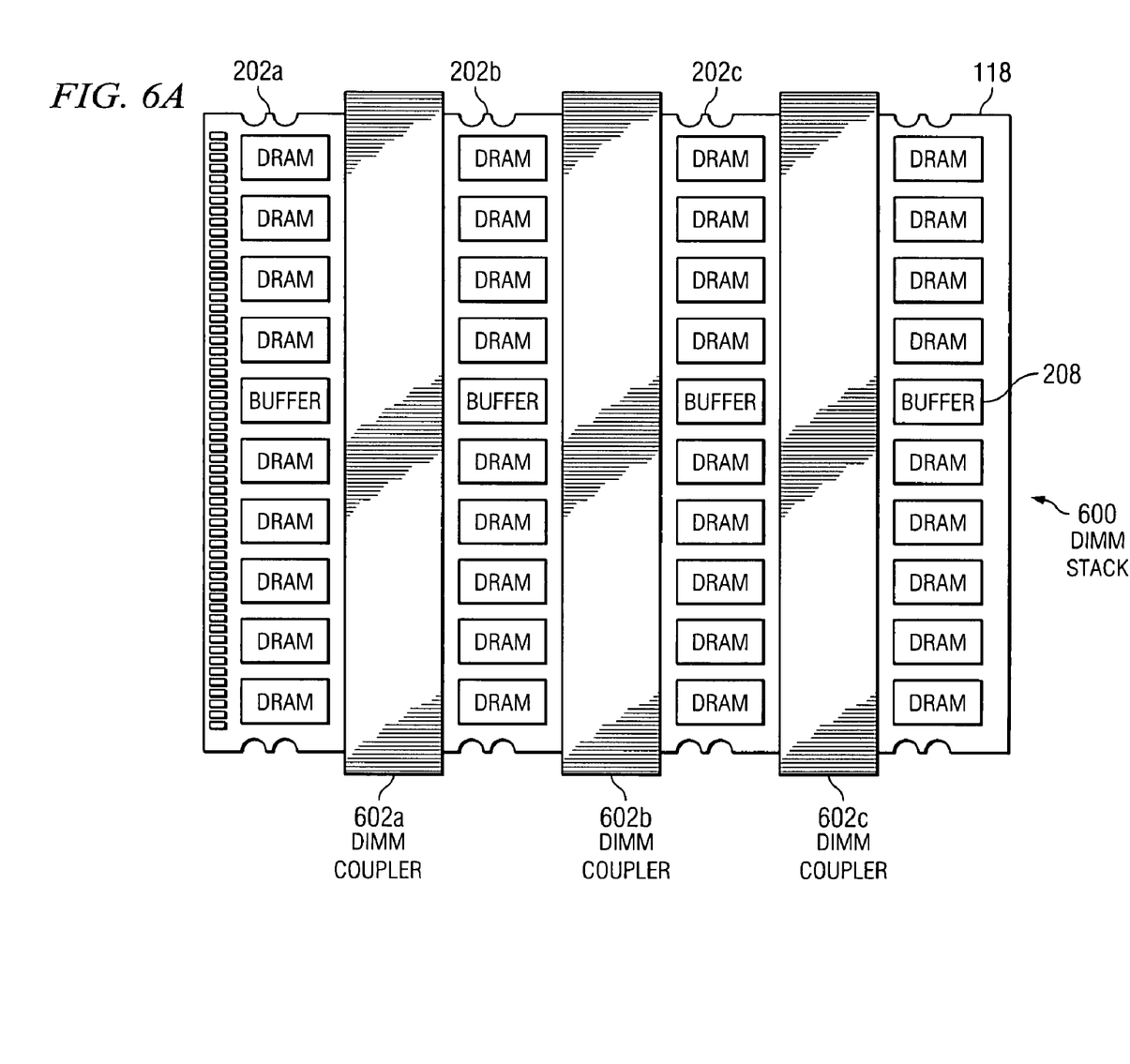
FIG. 6a illustrates the inventive DIMMs stacked and coupled using double-female connectors.

Besides being useful in connecting a motherboard to a memory expansion board, double-connector-edge DIMMs 202 can also be stacked as a DIMM stack 600, as shown in FIG. 6*a*. For example, double-connector-edge DIMM 202*a* can be coupled to double-connector-edge DIMM 202*b* with a DIMM coupler 602*a*. Double-connector-edge DIMM 202*b* can be coupled to double-connector-edge DIMM 202*c* via DIMM coupler 602*b*. As shown in exemplary form, double-connector-edge DIMM 202*c* can then be coupled by DIMM coupler 602*c* to a terminal single-connector-edge DIMM 118, which in a preferred embodiment has a buffer 208 as found in double-connector-edge DIMMs 202. Alternatively, single-connector-edge DIMM 118 can be a double-connector-edge DIMM 202 that has a terminator electrical cap (not shown) that causes the uppermost edge of that double-connector-edge DIMM 202 to re-direct inwardly data in a manner consistent to that of a single-connector-edge DIMM 118. In another alternate embodiment, the uppermost DIMM 202 has internal logic that "knows" that there are no "upstream" memories, and thus is able to send data back "downstream."

Figure 6B:
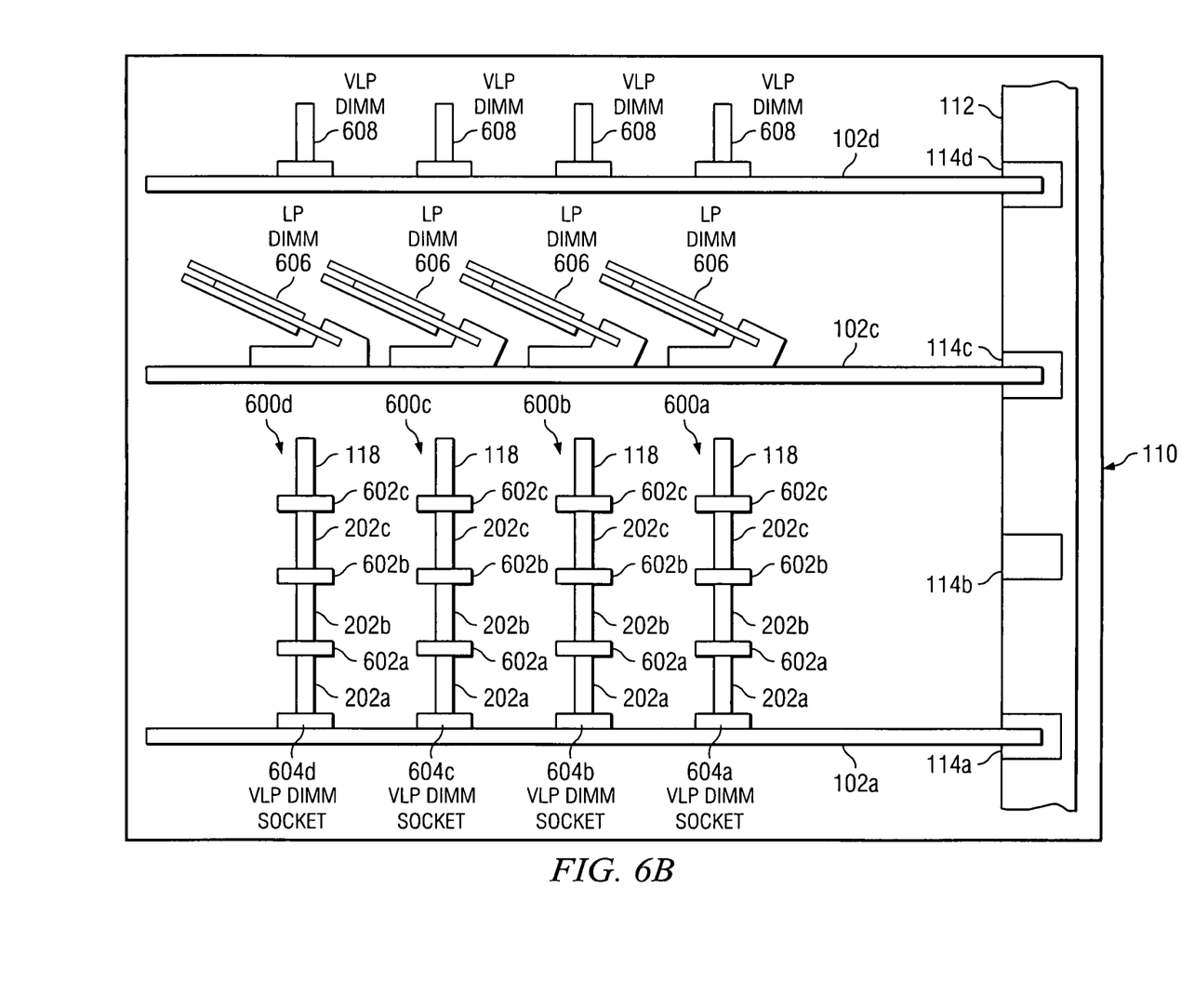
FIG. 6b depicts the stacked DIMMs shown in FIG. 6a installed on a server blade motherboard.

Referring now to FIG. 6*b*, a blade server chassis 110 utilizing double-connector-edge DIMMs 202 as shown in FIG. 6*a* is shown. As depicted for illustrative purposes only, understand that midplane 112 can support traditional server blade motherboards 102*d* and 102*c* that respectively support the use of Very Low Profile (VLP) DIMMs 608 and Low Profile (LP) DIMMs 606. As depicted, board slot 114*b* is vacant, leaving additional head room above server blade motherboard 102*a*. This affords enough room to stack double-connector-edge DIMMs 202, as shown in FIG. 6*a*, and then mounting these stacks of DIMMs 202 into standard VLP DIMM sockets 604, as shown in FIG. 6*b*. Note that in a preferred embodiment, DIMM stacks 600 are clipped together, either permanently or temporarily, to allow ease and freedom to add or remove sections of DIMMs.

Figure 6C:
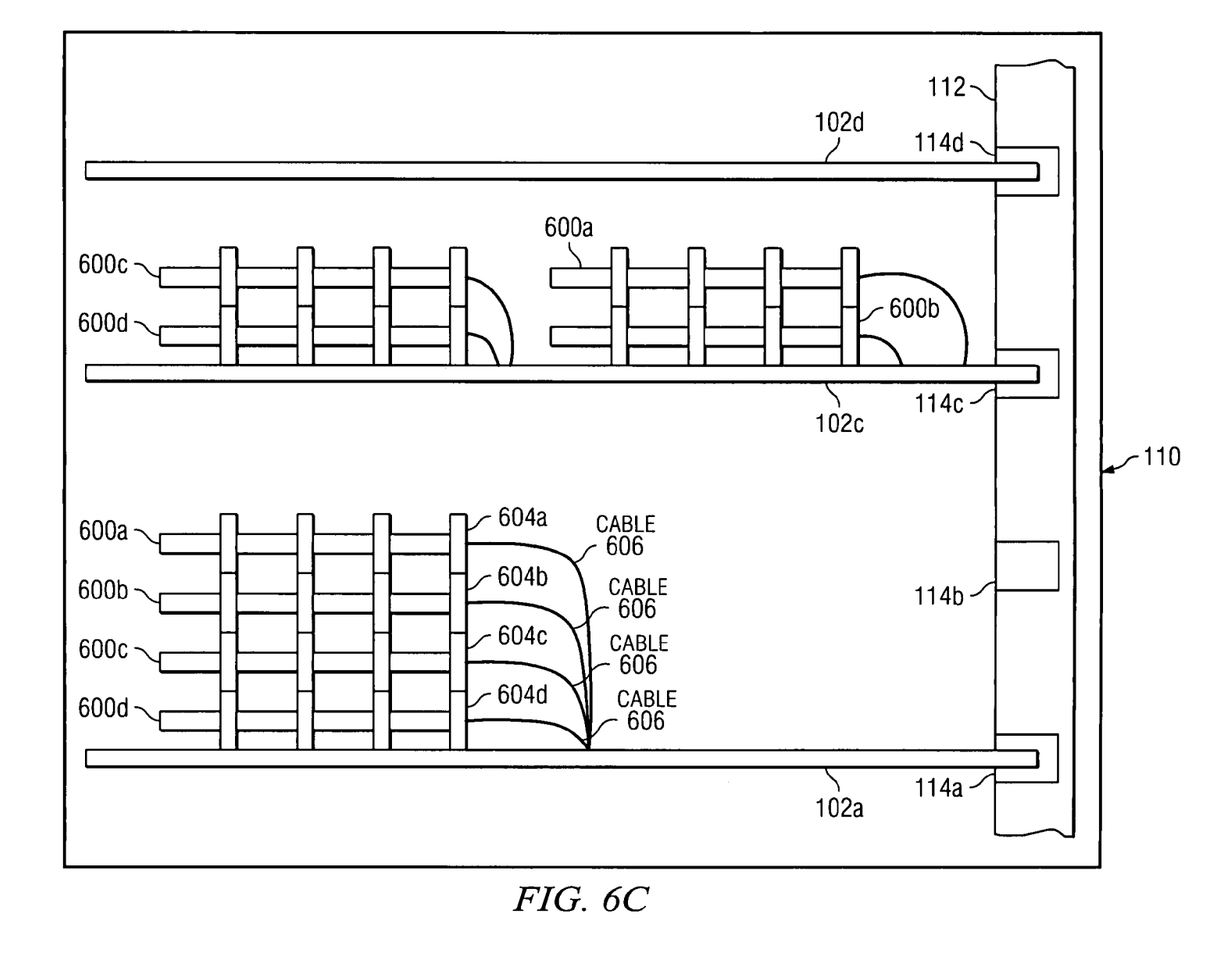
FIG. 6c illustrates the stacked DIMMs shown in FIG. 6a coupled to a DIMM socket that is coupled to a motherboard via a cable.

While the configuration shown in FIG. 6*b*, is useful in tower computers and other designs that have large amounts of space, FIG. 6*c* shows a preferred embodiment in situations in which space is at a premium, such as in a blade server chassis 110. Rather than vertically stack each DIMM stack 600, as shown in FIG. 6*b*, the DIMM stacks 600 can be "laid down" horizontally, using cables 606 connected to each VLP DIMM socket 604. The cables 606, each coupled to a channel, can be configured such that each DIMM stack 600 has its own cable 606 and thus own channel, or two or more DIMM stacks 600 can use the same cable 606. Alternatively, cables 606 may be a ganged connector that provides the same functionality as the multiple cables 606. Depending on how much space is available, the DIMM stacks 600 can be stacked two high (as on server blade 102*c*), four high (as shown on server blade 102*a*), or any other configuration desired. Preferably, each DIMM stack 600 is mechanically clipped to an adjacent DIMM stack 600 using non-conductive clips (not shown) for stability.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

The present invention thus provides the benefit over the prior art in allowing memory expansion that requires no additional cost or special connectors on the motherboard, while at the same time giving maximum performance in a minimal space configuration.

While the invention has been particularly shown and described with reference to a preferred embodiment, it will be understood by those skilled in the art that various changes in form and detail may be made therein without departing from the spirit and scope of the invention. For example, while the inventive DIMM 202 has been shown as used in a computer chassis, DIMM 202 may be used in any environment where it is desired to expand memory as described.

What is claimed is:

1. A computer system comprising:
   a memory module composed of:
     a first edge;
     an opposite second edge;
     a first set of data pins on the first edge;
     a second set of data pins on the second edge; and
     a data buffer having a driver, wherein the buffer is capable of retransmitting incoming data to the memory module by storing a temporary copy of the incoming data and then transmitting the stored temporary copy of the incoming data away from the memory module, wherein data on the first set of data pins is directly isolated from data on the second set of data pins.

2. The computer system of claim 1, further comprising:
   a memory module connector that electrically connects said first set of data pins on a first memory module to said second, set of data pins on a second memory module.

3. The computer system of claim 1, wherein the memory module is a Dual In-line Memory Module (DIMM).

4. The computer system of claim 3, further comprising:
   a DIMM expansion card, wherein the DIMM is plugged into a memory socket in the server blade motherboard via the first set of data pins, and wherein the second set of data pins are coupled to the DIMM expansion card.

5. The computer system of claim 3, further comprising:
   at least one DIMM stack, wherein each DIMM stack is constructed by coupling the first set of data pins on a first memory module to the second set of data pins on a second memory module.

6. The computer system of claim 1, further comprising:
   a server blade motherboard;
   a raw connector plug coupled to the server blade motherboard;
   a memory expansion board on which the memory module is mounted; and
   a cable coupling the memory module on the memory expansion board to the raw connector plug on the server blade motherboard.

7. A computer system comprising:
   a midplane;
   a server blade coupled to a first slot in the midplane;
   a memory expansion card coupled to a second slot in the midplane; and
   a memory module coupling the server blade to the memory expansion card, wherein the memory module comprises a data buffer that has a driver, wherein the buffer is capable of retransmitting incoming data to the memory module by storing a temporary copy of the incoming data and then transmitting the stored temporary copy of the incoming data away from the memory module, wherein data on a first set of data pins on the memory module is directly isolated from data on a second set of data pins on the memory module.

8. The computer system of claim 7, further comprising:
   a first set of pins on a first edge of the memory module;
   a second set of pins on a second edge of the memory module;
   a standard memory module socket on the server blade; and
   a memory connection socket connected to at least one standard memory socket on the memory expansion card, wherein the first set of pins on the memory module is coupled to the standard memory module socket on the server blade and the second set of pins is coupled to the memory connection socket.

9. The computer system of claim 7, further comprising:
   a first set of pins on a first edge of the memory module;
   a second set of pins on an opposite second edge of the memory module;
   a standard memory module socket on the server blade; and
   a connector clip connected to wiring to at least one standard memory socket on the memory expansion card, wherein the first set of pins is coupled to the standard memory module socket on the server blade and the second set of pins is coupled to the connector clip.

10. The computer system of claim 7, wherein the memory module is a Dual In-line Memory Module (DIMM).

11. The computer system of claim 7, wherein the memory expansion card is electrically isolated from the midplane.

12. A memory module comprising:
a first edge;
an opposite second edge;
a first set of data pins on the first edge;
a second set of data pins on the second edge; and
a data buffer having a driver, wherein the buffer is capable of retransmitting incoming data to the memory module by storing a temporary copy of the incoming data and then transmitting the stored temporary copy of the incoming data away from the memory module, wherein data on the first set of data pins is directly isolated from data on the second set of data pins.

13. The memory module of claim 12, wherein the memory module is a first memory module, and wherein the first memory module is coupled to a second memory module via a memory module connector, wherein the second memory module has a first and second edge with pins as described for the first memory module, and wherein the memory module connector couples the first set of data pins on the first memory module to the second set of data pins on the second memory module.

14. The memory module of claim 12, wherein the memory module is a Dual In-line Memory Module (DIMM).

15. The memory module of claim 12, wherein the memory module is mounted on a memory expansion board that is coupled to a motherboard by a raw connector.

16. The memory module of claim 15, wherein the raw connector has a driver buffer that temporarily stores and then retransmits a clean copy of data between the motherboard and the memory expansion board.

* * * * *